United States Patent
Wu et al.

(10) Patent No.: US 7,295,725 B1
(45) Date of Patent: Nov. 13, 2007

(54) ELECTRO-OPTICAL CIRCUIT BOARD

(75) Inventors: Cherng-Shiun Wu, Hsinchu (TW); Hsien-Huan Chiu, Hsinchu (TW); Shin-Ge Lee, Hsinchu (TW); Ying-Chih Chen, Hsinchu (TW)

(73) Assignee: Industrial Technology Research Institute, Chu-Tung, Hsinchu (TW)

( * ) Notice: Subject to any disclaimer, the term of this patent is extended or adjusted under 35 U.S.C. 154(b) by 0 days.

(21) Appl. No.: 11/706,879

(22) Filed: Feb. 13, 2007

(30) Foreign Application Priority Data

Oct. 25, 2006 (TW) ............................... 95139346 A

(51) Int. Cl.
G02B 6/12 (2006.01)
G02B 6/26 (2006.01)
G02B 6/42 (2006.01)
G02B 6/10 (2006.01)
G02F 1/035 (2006.01)
G02F 1/295 (2006.01)

(52) U.S. Cl. .................. 385/14; 385/2; 385/8; 385/15; 385/39; 385/40; 385/129; 385/130; 385/131; 385/132

(58) Field of Classification Search ................ 385/2, 385/8, 14, 15, 39, 40, 129–132
See application file for complete search history.

(56) References Cited

U.S. PATENT DOCUMENTS

| 6,496,299 | B2 * | 12/2002 | Yamamoto et al. ......... 359/328 |
| 6,804,423 | B2 | 10/2004 | Tsukamoto et al. |
| 2006/0120658 | A1 * | 6/2006 | Naitou et al. ................. 385/14 |

FOREIGN PATENT DOCUMENTS

KR 10-2004-0106674 * 12/2004 .................. 385/14

* cited by examiner

*Primary Examiner*—Frank G. Font
*Assistant Examiner*—Jerry Martin Blevins
(74) *Attorney, Agent, or Firm*—Morris Manning Martin LLP; Tim Tingkang Xia, Esq.

(57) ABSTRACT

An electro-optical circuit board is provided, which includes an electrical wiring board and an optical wiring board. The optical wiring board includes a first metal substrate, an optical guiding layer formed on the first metal substrate, and a metal supporting structure formed around the optical guiding layer, wherein the optical guiding layer includes an optical waveguide and a clad wrapping the optical waveguide. When the electrical wiring board is joined with the optical wiring board through a laminating process, the metal supporting structure absorbs the pressure applied to the electro-optical circuit board.

21 Claims, 4 Drawing Sheets

ELECTRO-OPTICAL CIRCUIT BOARD

CROSS-REFERENCE TO RELATED APPLICATIONS

This non-provisional application claims priority under 35 U.S.C. § 119(a) on Patent Application No(s). 095139346 filed in Taiwan, R.O.C. on Oct. 25, 2006, the entire contents of which are hereby incorporated by reference.

BACKGROUND OF THE INVENTION

1. Field of Invention

The present invention relates to an electro-optical circuit board, and more particularly, to an electro-optical circuit board having an optical waveguide supporting structure.

2. Related Art

With the development of Internet, people's demanding on the bandwidth of the network is increasingly high, and the optical network has gradually developed towards the trend of large volume, variable changes, high reliability, and cost efficiency. The optical communication has been developed from the backbone network, the metropolitan network, the access network, the storing network towards completely achieving the optical fiber, and furthermore, the optical networking has been achieved step by step, and the fiber to the home (FTTH) has been gradually established. The bottleneck of the bandwidth lies in the so-called "the last one meter", which includes the following three fields, Rack to Rack, Board to Board, and Chip to Chip.

Currently, the short distance interconnection technology is still mainly achieved by copper leads. As the development of the VLSI technology, IC is capable of processing the more complex science and technology analysis and calculation, and achieving the high performance network system, which promotes the FTTH wideband service. The volume of the IC is increasingly reduced, which is suitable for achieving the products of mobile phone, PDA, hand-held computer, so as to bring more convenience and fun in using. In the past two decades, the operating frequency of the microprocessor has gradually increased, and the trend still goes on in the future. The forecasting of the International Technology Roadmap for Semiconductor (ITRS) shows that, the frequency of the microprocessor reaches up to 10 GHz in 2011, but it is not easy for the IC to achieve a high frequency connection to the external device. Nowadays, the electrically interconnection of the chip is constructed on the printed circuit board (PCB), on the electrical switching joint, via holes, and branches, and the discontinuous impedance causes the attenuation and the distortion of the signal, and even worse, the transmitting distance is influenced.

The conventional electrical connecting performance is greatly limited by the signal attenuation, the electromagnetic radiation and interference. In order to overcome the above problems, the optical interconnection may be used to achieve the high bandwidth and high performance data transmission, since it has the advantages of without causing the problem of electromagnetic radiation and without being interfered by the electromagnetic radiation to generate noises. The optical method is used to connect the computer chip, the circuit board, the backboard, the host, and the processor, the high speed photon method is used to transmit signals, so as to solve the bottleneck problem of heating, speed, and limited bandwidth during the conventional electronic transmission.

In US Publication Patent U.S. Pat. No. 6,804,423, entitled "OPTICAL/ELECTRICAL WIRING MOUNTED BOARD AND METHOD OF MANUFACTURING OPTICAL-ELECTRICAL WIRING BOARD", an electro-optical lead substrate is provided. Referring to FIGS. 1 and 2, FIG. 1 is a top view of a conventional electro-optical circuit board 10, and FIG. 2 is a cross-sectional side view of the conventional electro-optical circuit board 10 in FIG. 1 obtained along a 2-2 sectional line. As shown in FIGS. 1 and 2, the conventional electro-optical circuit board 10 includes an optical guiding layer 12 and an electrical wiring board 14 formed on the optical guiding layer. The optical guiding layer 12 includes a core to serve as the optical waveguide, which is formed by a horizontal optical waveguide 20 and a vertical optical waveguide 22, so as to transmit high frequency optical signals. The electrical wiring board 14 has a through-hole to accommodate the vertical optical waveguide 22. Moreover, the optical guiding layer 12 further includes a horizontal clad 30 formed around the horizontal optical waveguide 20 to make the horizontal optical waveguide 20 buried therein, and a vertical clad 32 formed around the vertical optical waveguide 22 to make the vertical optical waveguide 22 be buried therein. Furthermore, four optical pads 52, 54, 56, and 58 are formed on the surface of the electrical wiring board 14, so as to make the optical guiding layer 12 be electrically interconnected to the electrical wiring board 14.

In addition, a reflecting mirror 40 is further disposed in the optical guiding layer 12, and disposed between the horizontal optical waveguide 20 and the vertical optical waveguide 22 by way of forming an angle of 45 degrees with the horizontal optical waveguide 20 and the vertical optical waveguide 22 respectively. The horizontal clad 30 and the vertical clad 32 are fabricated by the material with the index of refraction lower than that of the core, so the optical signals are sent from the optical element (not shown), and then, enter into the horizontal optical waveguide 20 and then reflected to the vertical optical waveguide 22 through the reflecting mirror 40, so as to achieve the excellent optical signal transmission.

The advantage of the above construction is that, the optical waveguide is integrated with the circuit board, and it is easy to join the optical element with the optical waveguide and the circuit board, so as to fabricate an electro-optical circuit board capable of transmitting optical signals and electrical signals. However, the circuit board is joined with the optical guiding layer through the laminating process, which is a high-temperature and high-pressure process. The optical waveguide is fabricated by the polymer material, and it is easily deformed in the high temperature and the high pressure, and the transition temperature of the optical waveguide is only about 180° C. In the laminating process with high temperature and high pressure, the optical path of the whole optical waveguide is offset, and even if it returns to the normal temperature and normal pressure, it is impossible to return to the expected optical coupling efficiency, so as to result in the great loss of the optical signal. Referring to FIG. 3, it is a curve diagram of the mirror angle and optical coupling efficiency of the conventional optical waveguide. As shown in FIG. 3, in the laminating process, when the reflecting mirror of the optical waveguide deforms from 45 degrees to 38 degrees, the optical coupling efficiency is reduced form 83% to 39%.

Therefore, it is an urgent problem to be solved in this field that how to successfully join the optical waveguide with weak structure with the circuit board without affecting the laminating process of the conventional PCB, so as to not affect the properties of the optical waveguide.

SUMMARY OF THE INVENTION

In view of the above problems, the main object of the present invention is to provide an electro-optical circuit board, such that in the laminating process with high temperature and high pressure, the deformation of the optical waveguide is reduced to the minimum level, and the deformation of the mirror is not generated.

According to the above object, the present invention provides an electro-optical circuit board, which comprises an electrical wiring board for transmitting an electrical signal, and an optical wiring board joined with the electrical wiring board for transmitting an optical signal. The optical wiring board comprises a first metal substrate, an optical guiding layer formed on the first metal substrate, and a metal supporting structure formed around the optical guiding layer. In addition, the optical guiding layer includes an optical waveguide and a clad wrapping the optical waveguide. When the electrical wiring board is joined with the optical wiring board through a laminating process, the metal supporting structure absorbs the pressure applied to the electro-optical circuit board.

According to the above object, the present invention further provides an electro-optical circuit board, which comprises an electrical wiring board for transmitting an electrical signal, and an optical wiring board joined with the electrical wiring board for transmitting an optical signal. The optical wiring board comprises a first metal substrate, and an optical guiding layer formed on the first metal substrate. In addition, the optical guiding layer is fabricated by a metal sheet, and the metal sheet has a plurality of recesses, and a protective rib is formed between each two recesses. When the electrical wiring board is joined with the optical wiring board by a laminating process, the protective ribs of the optical guiding layer absorbs the pressure applied to the electro-optical circuit board.

In the present invention, the following functions are achieved. 1. The optical waveguide is combined with the process for manufacturing PCB, and the optical waveguide becomes a layer in the PCB, so as to transmit the optical signal. 2. Copper is used to fabricate the optical guiding layer, and the stiffness of the whole electro-optical circuit board is increased, so as to avoid the deformation or damage of the optical waveguide due to the high temperature and the high pressure effect in the laminating process. 3. After the optical guiding layer made of copper is properly processed or coated, a preferred reflecting surface is formed to increase the optical coupling efficiency, and to reduce the transmitting loss of the common optical waveguide and the optical interference between multi-channel optical waveguides. 4. It is compatible with the conventional laminating process, and it is not necessary to particularly develop the laminating flow or table in order to develop the electro-optical circuit board technology, so the fabricating cost of the electro-optical circuit board is greatly reduced.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, which thus is not limitative of the present invention, and wherein.

DETAILED DESCRIPTION OF THE INVENTION

Figure 1:
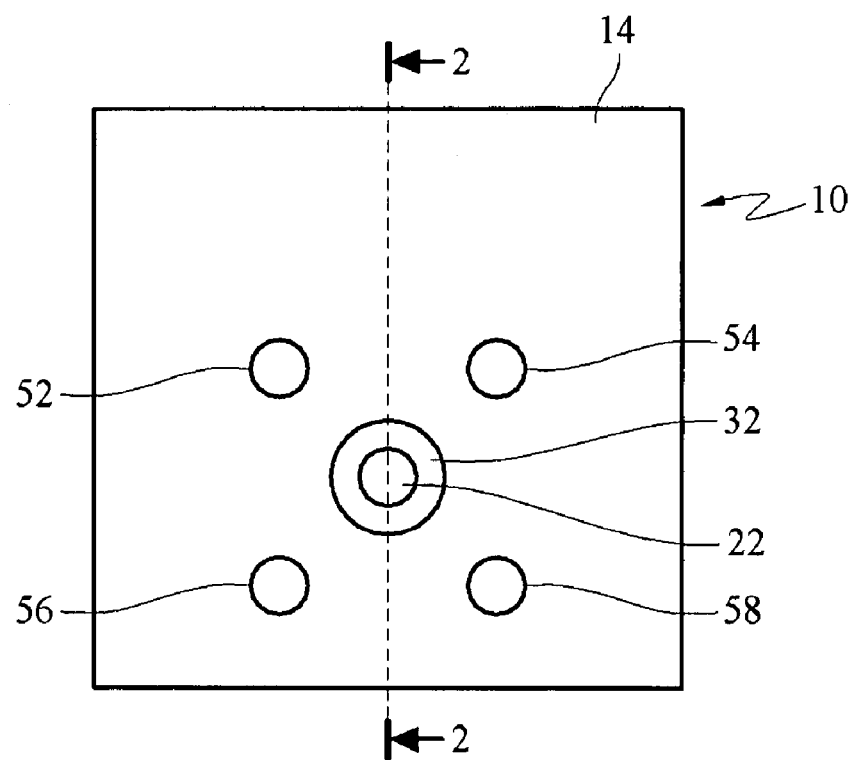
FIG. 1 is a top view of a conventional electro-optical circuit board.
Figure 2:
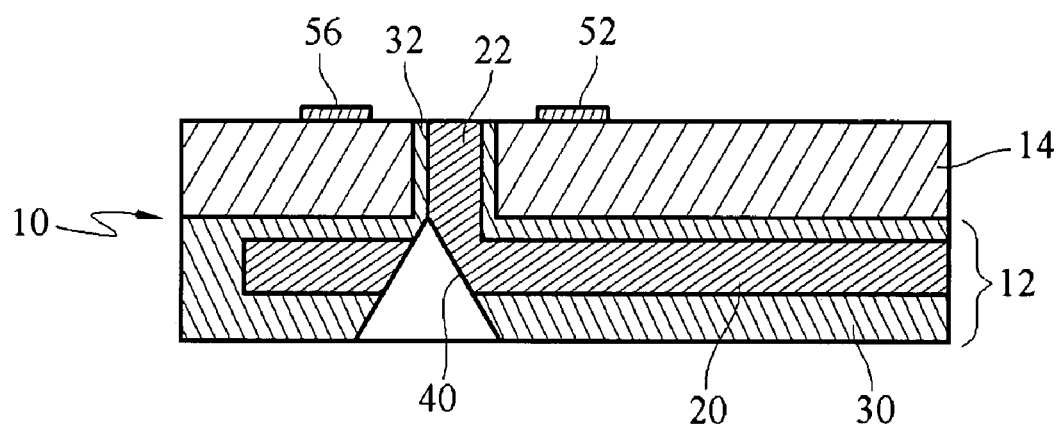
FIG. 2 is a cross-sectional side view of the electro-optical circuit board in FIG. 1 obtained along a 2-2 sectional line.
Figure 3:
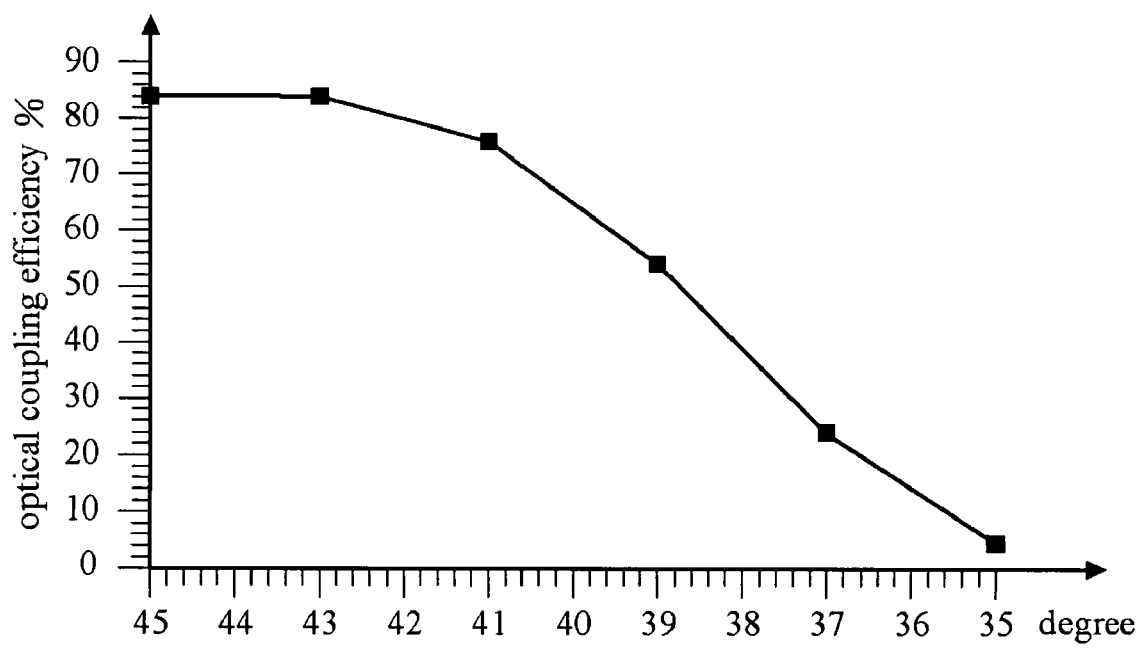
FIG. 3 is a curve diagram of the mirror angle and the optical coupling efficiency of the conventional optical waveguide.
Figure 4:
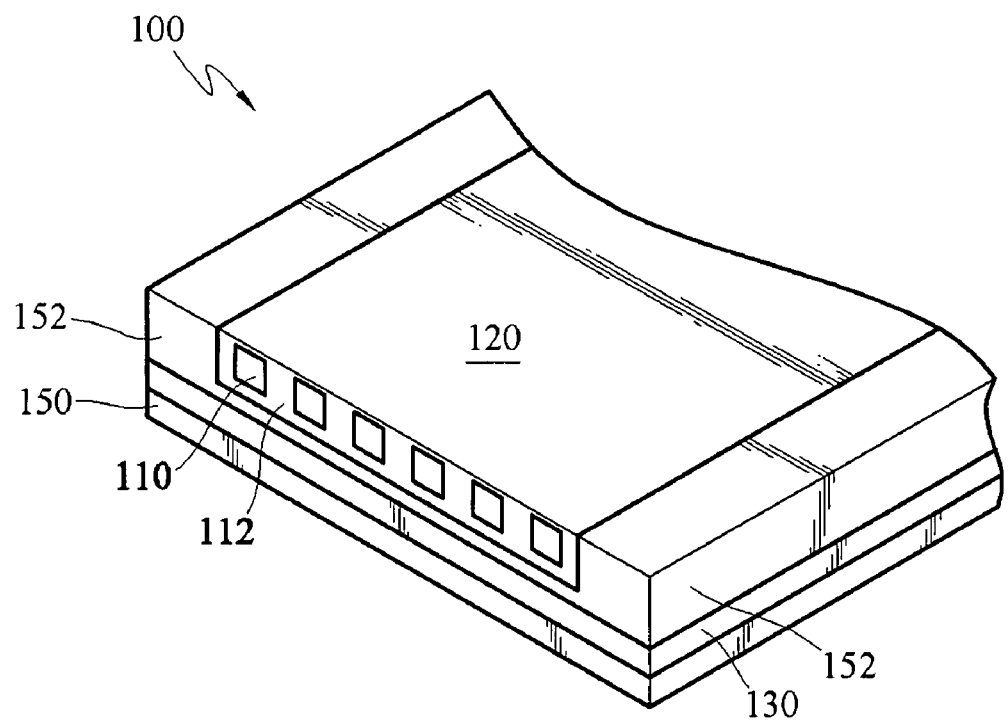
FIG. 4 is a schematic view of an optical wiring board of an electro-optical circuit board according to a first embodiment of the present invention.

Referring to FIG. 4, it is a schematic view of an optical wiring board 100 of an electro-optical circuit board according to a first embodiment of the present invention. As shown in FIG. 4, the optical wiring board 100 of the first embodiment of the present invention includes a metal substrate 150, a glass fiber layer 130 formed on the metal substrate 150, an optical guiding layer 120 formed on the glass fiber layer 1301 and a metal supporting structure 152 formed around the optical guiding layer 120 and on the glass fiber layer 130.

The optical guiding layer 120 is formed by an optical waveguide and a clad 112. In this embodiment, the optical waveguide is a multi-channel optical waveguide, which includes a plurality of cores 110 embedded in the clad 112, such that the clad 112 totally wraps the cores 110. Since the index of refraction of the material of the clad 112 is smaller than that of the cores 110, when transmitting the optical signal, the optical signal is only transmitted in the cores 110.

Figure 5:
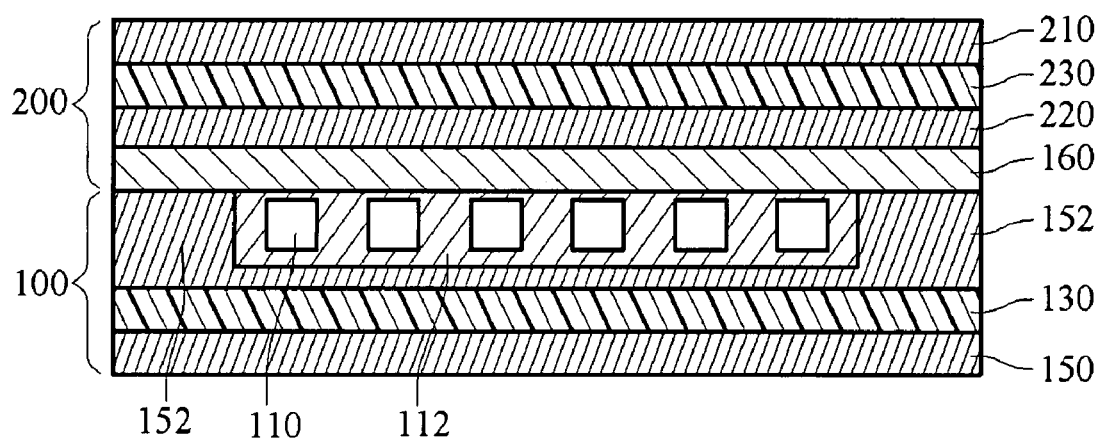
FIG. 5 is a schematic view of the electro-optical circuit board according to the first embodiment of the present invention.

Referring to FIG. 5, it is a schematic view of the electro-optical circuit board according to the first embodiment of the present invention. As shown in FIG. 5, the electro-optical circuit board of the present invention is formed by an electrical wiring board 200, an optical wiring board 100, and a join layer 160 disposed between the electrical wiring board 200 and the optical wiring board 100. In this embodiment, the electrical wiring board 200 includes an upper metal substrate 210, a lower metal substrate 220, and a glass fiber layer 230 formed between the upper metal substrate 210 and the lower metal substrate 220. When the electro-optical circuit board of the present invention is fabricated by a laminating process, firstly, the join layer 160 is formed on the optical guiding layer 120 and the metal supporting structure 152 of the optical wiring board 100. Then, the lower metal substrate 220 of the electrical wiring board 200 is adhered on the join layer 160. Finally, a pressure is applied to the electrical wiring board 200 to firmly join the electrical wiring board 200 with the optical wiring board 100.

The laminating process is a process with high temperature and high pressure, thus, when the pressure applied to the electrical wiring board 200 is transferred to the optical wiring board 100, since the lower metal substrate 220 of the electrical wiring board 200 and the metal supporting structure 152 are both fabricated by the metal material, the metal supporting structure 152 around the optical guiding layer 120 absorbs the pressure from the electrical wiring board 200, so as to prevent the core 110 of the optical waveguide in the optical guiding layer 120 from being damaged and deformed.

Figure 6:
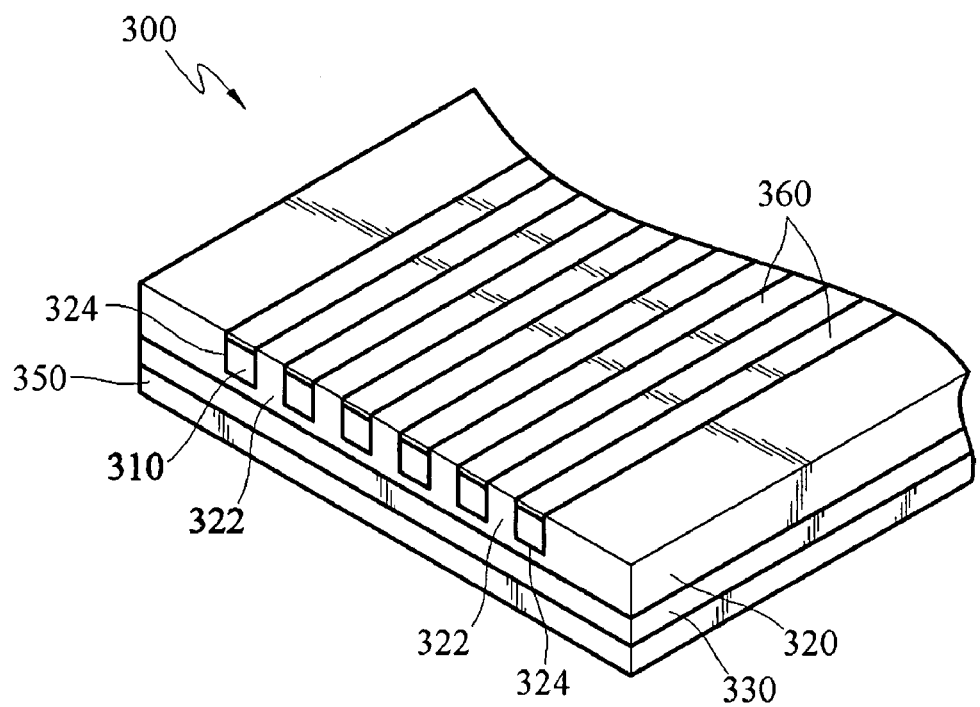
FIG. 6 is a schematic view of an optical wiring board of an electro-optical circuit board according to a second embodiment of the present invention.
Figure 7:
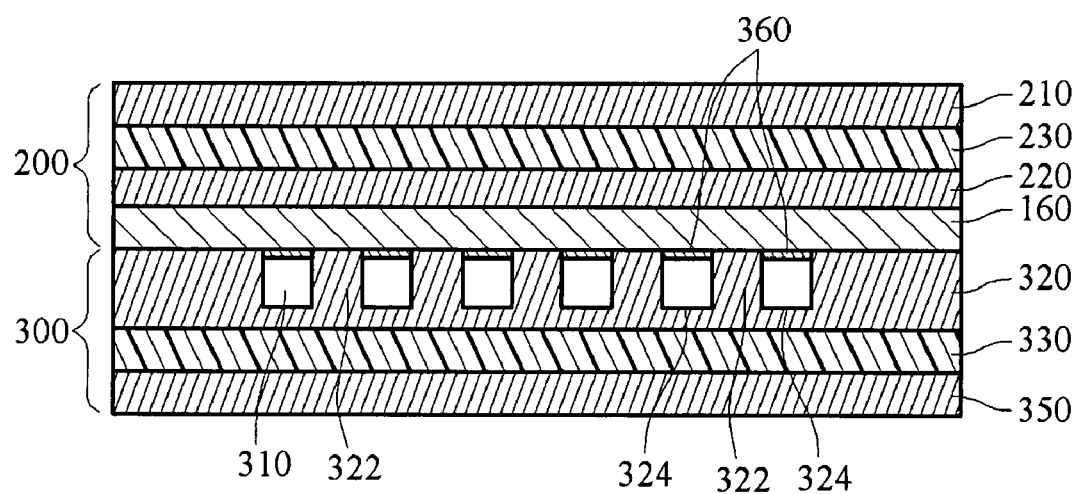
FIG. 7 is a schematic view of the electro-optical circuit board according to the second embodiment of the present invention.

Referring to FIGS. 6 and 7, FIG. 6 is a schematic view of an optical wiring board according to a second embodiment of the present invention, and FIG. 7 is a schematic view of the electro-optical circuit board according to the second embodiment of the present invention. As shown in FIG. 6, the optical wiring board 300 of the second embodiment of the present invention includes a metal substrate 350, a glass fiber layer 330 formed on the metal substrate 350, and an optical guiding layer 320 formed on the glass fiber layer 330.

The largest difference between the optical guiding layer 320 of this embodiment and the optical guiding layer 120 of the first embodiment is that, a plurality of optical channel recesses is formed on the optical guiding layer 320 of this embodiment through a metal sheet to serve as the core 310 of the optical waveguide. In the present invention, the recess is formed by a dry etching technology. After the recesses are formed, each recess is made to have a smooth optical reflecting surface 324 through a suitable process (e.g., a coating process). Next, a clad 360 is formed on the optical guiding layer 320, and the index of refraction of the material of the clad 360 is smaller than that of the core 310, so when transmitting the optical signal, the optical signal is only transmitted in the core 310. In addition, a preset gap is maintained between the cores 310, which is used as the protective rib 322 of the optical guiding layer 320.

As shown in FIG. 7, a join layer 160 is disposed between the electrical wiring board 200 and the optical wiring board 300, and the electrical wiring board 200 further includes an upper metal substrate 210, a lower metal substrate 220, and a glass fiber layer 230 formed between the upper metal substrate 210 and the lower metal substrate 220. When the laminating process is used to fabricate the electro-optical circuit board of this embodiment, firstly, the join layer 160 is formed on the optical guiding layer 320 of the optical wiring board 300. Next, the lower metal substrate 220 of the electrical wiring board 200 is adhered on the join layer 160. Finally, a pressure is applied to the electrical wiring board 200, so as to firmly join the electrical wiring board 200 with the optical wiring board 300.

The optical guiding layer 320 of this embodiment is fabricated by metal materials, and the protective ribs 322 exist between the recesses of the optical waveguide. When the pressure applied to the electrical wiring board 200 is transferred to the optical wiring board 300, the lower metal substrate 220 of the electrical wiring board 200, the metal substrate 350 and the protective rib 322 of the optical wiring board 300 are all fabricated by the metal material, so the protective ribs 322 of the optical guiding layer 320 are used to disperse the pressure transmitted from the electrical wiring board 200 to the optical wiring board 300, so as to prevent the core 310 of the optical waveguide in the optical guiding layer 320 from being damaged and deformed.

In addition, each recess in the optical guiding layer 320 has a smooth optical reflecting surface 324 and is processed through a coating process, and the surface of the clad 360 facing the core 310 is also processed through a coating process (e.g., a metal layer is coated thereon), so as to provide the reflecting function during the transferring of the optical signal, the transmitting loss of the optical signal is reduced, the transmitting energy of the optical signal is increased, and during the multi-channel optical waveguide transmission, the optical reflecting surface 324 and the coated clad 360 may excellently avoid the optical interference between the optical waveguides.

It should be particularly noted that, in each embodiment of the present invention, the upper metal substrate 210 and the lower metal substrate 220 of the electrical wiring board 200 are fabricated by copper, and the join layer 160 is fabricated by the material of polypropylene. In addition, the metal supporting structure 152 and the optical guiding layer 320 of the first and second embodiments of the present invention are both fabricated by copper. Furthermore, in the present invention, the reflecting mirror (not shown) as that mentioned in the conventional art is also disposed in the optical waveguide, and since the metal supporting structure 152 and the protective rib 322 have preferred stiffness to disperse the pressure transmitted to the optical wiring board during the laminating process with high temperature and high pressure, the deformation of the optical waveguide is reduced to the minimum level, and the mirror deformation of the conventional art is avoided.

As compared with the conventional art, the present invention may achieve the following effects. 1. The optical waveguide is combined with the process for manufacturing the PCB, and the optical waveguide becomes a layer in the PCB, so as to transmit the optical signal. 2. Copper is used to fabricate the optical guiding layer, so that the stiffness of the whole electro-optical circuit board is increased, so as to prevent the optical waveguide from being deformed and damaged due to the high temperature and the high pressure effect in the laminating process. 3. After the optical guiding layer made of copper is properly processed or coated, the preferred reflecting surface is formed to increase the optical coupling efficiency, and to reduce the transmitting loss of the common optical waveguide and the optical interference between the multi-channel optical waveguides. 4. It is compatible with the conventional laminating process, and it is not necessary to particularly develop the laminating flow or table in order to develop the electro-optical circuit board technology, so the fabricating cost of the electro-optical circuit board is greatly reduced. Therefore, the present invention provides an electro-optical circuit board with the advantages in cost, process, and structural stiffness, which may be used as the construction of the future electro-optical circuit board.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An electro-optical circuit board, comprising:
an electrical wiring board, for transmitting an electrical signal; and
an optical wiring board, joined with the electrical wiring board, for transmitting an optical signal, comprising:
a first metal substrate;
an optical guiding layer, formed on the first metal, and having an optical waveguide and a clad wrapping the optical waveguide; and
a metal supporting structure, formed around the optical guiding layer;
wherein when the electrical wiring board is joined with the optical wiring board by a laminating process, the metal supporting structure absorbs the pressure applied to the electro-optical circuit board.

2. The electro-optical circuit board as claimed in claim 1, wherein the optical wiring board further comprises a first glass fiber layer formed between the first metal substrate and the optical guiding layer and the metal supporting structure.

3. The electro-optical circuit board as claimed in claim 1, further comprising a join layer formed between the electrical wiring board and the optical wiring board.

4. The electro-optical circuit board as claimed in claim 3, wherein the material of the joint layer is polypropylene.

5. The electro-optical circuit board as claimed in claim 1, wherein the material of the first metal substrate is copper.

6. The electro-optical circuit board as claimed in claim 1, wherein the material of the metal supporting structure is copper.

7. The electro-optical circuit board as claimed in claim 2, wherein the electrical wiring board comprises:
- a second metal substrate;
- a third metal substrate; and
- a second glass fiber layer, formed between the second metal substrate and the third metal substrate.

8. The electro-optical circuit board as claimed in claim 7, wherein the material of the second metal substrate is copper.

9. The electro-optical circuit board as claimed in claim 7, wherein the material of the third metal substrate is copper.

10. An electro-optical circuit board, comprising:
- an electrical wiring board, for transmitting an electrical signal; and
- an optical wiring board, joined with the electrical wiring board, for transmitting an optical signal, comprising:
- a first metal substrate;
- an optical guiding layer, formed on the first metal substrate, and formed by a metal sheet, wherein the metal sheet has a plurality of recesses, and a protective rib is formed between each two recesses; and
- a clad, formed on the optical guiding layer;
- wherein when the electrical wiring board is joined with the optical wiring board by a laminating process, the protective ribs of the optical guiding layer absorbs the pressure applied to the electro-optical circuit board.

11. The electro-optical circuit board as claimed in claim 10, wherein the optical wiring board further comprises a first glass fiber layer formed between the first metal substrate and the optical guiding layer.

12. The electro-optical circuit board as claimed in claim 10, wherein the recesses of the optical guiding layer is fabricated by drying etching.

13. The electro-optical circuit board as claimed in claim 12, wherein the surfaces of the plurality of recesses form optical reflecting surfaces by a coating process.

14. The electro-optical circuit board as claimed in claim 13, wherein a surface of the clad facing the recesses forms the optical reflecting surface by the coating process.

15. The electro-optical circuit board as claimed in claim 10, further comprising a join layer formed between the electrical wiring board and the optical wiring board.

16. The electro-optical circuit board as claimed in claim 15, wherein the material of the join layer is polypropylene.

17. The electro-optical circuit board as claimed in claim 10, wherein the material of the first metal substrate is copper.

18. The electro-optical circuit board as claimed in claim 10, wherein the material of the optical guiding layer is copper.

19. The electro-optical circuit board as claimed in claim 11, wherein the electrical wiring board comprises:
- a second metal substrate;
- a third metal substrate; and
- a second glass fiber layer, formed between the second metal substrate and the third metal substrate.

20. The electro-optical circuit board as claimed in claim 19, wherein the material of the second metal substrate is copper.

21. The electro-optical circuit board as claimed in claim 19, wherein the material of the third metal substrate is copper.

* * * * *